(12) United States Patent
Li et al.

(10) Patent No.: US 11,222,674 B2
(45) Date of Patent: Jan. 11, 2022

(54) METHOD OF SEQUENTIALLY BIASING BIAS LINES IN MEMORY DEVICE FOR PROGRAM DISTURBANCE REDUCTION AND MEMORY DEVICE UTILIZING SAME

(71) Applicant: Yangtze Memory Technologies Co., Ltd., Wuhan (CN)

(72) Inventors: Shan Li, Wuhan (CN); Kaikai You, Wuhan (CN); Ying Cui, Wuhan (CN); Jianquan Jia, Wuhan (CN); Kaiwei Li, Wuhan (CN); An Zhang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/740,491

(22) Filed: Jan. 13, 2020

(65) Prior Publication Data

US 2021/0174852 A1     Jun. 10, 2021

Related U.S. Application Data

(63) Continuation of application No. PCT/CN2019/123942, filed on Dec. 9, 2019.

(51) Int. Cl.
*G11C 8/14* (2006.01)
*G11C 8/08* (2006.01)
(Continued)

(52) U.S. Cl.
CPC ............. *G11C 8/08* (2013.01); *G11C 7/14* (2013.01); *G11C 8/14* (2013.01); *G11C 11/4074* (2013.01); *G11C 11/4094* (2013.01); *G11C 16/0425* (2013.01); *G11C 16/0466* (2013.01); *G11C 16/0483* (2013.01); *G11C 16/06* (2013.01); *G11C 16/10* (2013.01); *G11C 16/30* (2013.01)

(58) Field of Classification Search
CPC .... G11C 8/08; G11C 7/14; G11C 8/14; G11C 16/0483; G11C 16/06; G11C 16/10; G11C 16/30
See application file for complete search history.

(56) References Cited

U.S. PATENT DOCUMENTS

| 7,471,566 B2 | 12/2008 | Hemink |
| 9,460,805 B1 | 10/2016 | Pang |

(Continued)

FOREIGN PATENT DOCUMENTS

| CN | 1777960 A | 5/2006 |
| CN | 101079321 A | 11/2007 |

(Continued)

*Primary Examiner* — Mushfique Siddique
(74) *Attorney, Agent, or Firm* — Winston Hsu

(57) ABSTRACT

A memory device includes a top select cell, a top dummy cell and a string of memory cells. The top select cell has a first terminal coupled to a bit line and a control terminal coupled to a top select line. The top dummy cell has a control terminal coupled to a top dummy word line. The string of memory cells has control terminals coupled to respective word lines. A method operating the memory device includes prior to a program operation, applying a pre-pulse voltage to the top dummy word line, the top select line and the bit line while applying a low voltage to the word lines, and then sequentially applying the low voltage to the top dummy word line, the top select line and the bit line while applying the low voltage to the word lines.

9 Claims, 10 Drawing Sheets

(51) Int. Cl.
*G11C 7/14* (2006.01)
*G11C 11/4074* (2006.01)
*G11C 11/4094* (2006.01)
*G11C 16/04* (2006.01)
*G11C 16/06* (2006.01)
*G11C 16/10* (2006.01)
*G11C 16/30* (2006.01)

(56) References Cited

U.S. PATENT DOCUMENTS

| | | | |
|---|---|---|---|
| 9,887,002 B1 * | 2/2018 | Zhang | G11C 7/12 |
| 10,559,368 B1 * | 2/2020 | Yang | G11C 16/0483 |
| 2010/0157686 A1 | 6/2010 | Lue | |
| 2011/0116311 A1 | 5/2011 | Torsi | |
| 2012/0307561 A1 * | 12/2012 | Joo | G11C 16/10 |
| | | | 365/185.17 |
| 2014/0301146 A1 | 10/2014 | Kaza | |
| 2019/0108883 A1 | 4/2019 | Yu | |
| 2019/0156901 A1 | 5/2019 | Chen | |
| 2019/0279726 A1 * | 9/2019 | Li | G11C 11/4085 |
| 2020/0168276 A1 * | 5/2020 | Yang | G11C 16/045 |

FOREIGN PATENT DOCUMENTS

| | | |
|---|---|---|
| CN | 101556827 A | 10/2009 |
| CN | 105280224 A | 1/2016 |
| WO | 2014/210424 A2 | 12/2014 |

* cited by examiner

METHOD OF SEQUENTIALLY BIASING BIAS LINES IN MEMORY DEVICE FOR PROGRAM DISTURBANCE REDUCTION AND MEMORY DEVICE UTILIZING SAME

CROSS REFERENCE TO RELATED APPLICATIONS

This application is a continuation of PCT patent application No. PCT/CN2019/123942, filed on 9 Dec. 2019, included herein by reference in its entirety.

BACKGROUND OF THE INVENTION

1. Field of the Invention

The invention relates to non-volatile memory, and in particular, to a method of reducing program disturbance in a memory device and the memory device utilizing the same.

2. Description of the Prior Art

Non-volatile memory has been used extensively in personal computers, telecommunications, consumer electronics and other fields. Electrically erasable programmable read only memory (EEPROM) and flash memory are among the most widely employed non-volatile memory.

As semiconductor devices continue to scale down, the degree of integration of non-volatile memory has increased, thereby enhancing device performance and price competitiveness. However, the increasing degree of integration also aggravates undesired coupling and interference between memory cells in the non-volatile memory during programming, reducing data reliability. Interference occurs when it is desired to program one selected memory cell on a selected word line without programming other cells on the same word line and on other word lines. When a voltage is applied to the selected word line, the voltage is applied not only to the selected cell but also to other cells unselected for programming along the same word line. The unselected cells on the selected word line, especially cells adjacent to the selected cell, may become inadvertently programmed. The unintentional programming of an unselected cell is referred to as "program disturbance".

SUMMARY OF THE INVENTION

According to one embodiment, a method of operating a memory device is provided. The memory device includes a top select cell, a top dummy cell and a string of memory cells. The top select cell has a first terminal coupled to a bit line, and a control terminal coupled to a top select line. The top dummy cell has a first terminal coupled to a second terminal of the top select cell, and a control terminal coupled to a top dummy word line. The string of memory cells has a first terminal coupled to a second terminal of the top dummy cell, and control terminals coupled to respective word lines. The method includes prior to a program operation, applying a pre-pulse voltage to the top dummy word line, the top select line and the bit line while applying a low voltage to the word lines, and then sequentially applying the low voltage to the top dummy word line, the top select line and the bit line while applying the low voltage to the word lines.

According to another embodiment, a memory device includes a bit line, a top select line, a top dummy word line, word lines, a top select cell, a top dummy cell, a string of memory cells and a controller. The top select cell includes a first terminal coupled to the bit line, a control terminal coupled to the top select line, and a second terminal. The top dummy cell includes a first terminal coupled to the second terminal of the top select cell, a control terminal coupled to the top dummy word line, and a second terminal. The string of memory cells includes a first terminal coupled to the second terminal of the top dummy cell, control terminals coupled to the respective word lines, and a second terminal. The controller is coupled to the bit line, the top select line, the top dummy word line and the word lines. Prior to a program operation, The controller applies a pre-pulse voltage to the top dummy word line, the top select line and the bit line while applying a low voltage to the word lines, and then sequentially applies the low voltage to the top dummy word line, the top select line and the bit line while applying the low voltage to the word lines.

These and other objectives of the present invention will no doubt become obvious to those of ordinary skill in the art after reading the following detailed description of the preferred embodiment that is illustrated in the various figures and drawings.

DETAILED DESCRIPTION

It will be understood that, the ordinal numbers "first", "second", "third" are used herein to distinguish various elements, components, regions, layers and/or sections, and these elements, components, regions, layers and/or sections should not be limited by the ordinal numbers. Position relative terms, such as "top" and "bottom", and the like, may be used herein to distinguish various elements, components, regions, layers and/or sections, and should not be used to limit the positions of the elements, components, regions, layers and/or sections.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intermediate elements or layers present.

Although embodiments of the inventive concept will be described with reference to a NAND flash memory devices, it will be understood that embodiments of the present inventive concept are not limited thereto to this configuration. For example, the inventive concept may be applied to nonvolatile memory devices, such as an Electrically Erasable and Programmable ROM (EEPROM), a NOR flash memory, a Phase-change RAM (PRAM), a Magnetic RAM (MRAM), a Resistive RAM (RRAM), a Ferroelectric RAM (FRAM), and the like, without departing from the scope of the present inventive concept.

Figure 1:
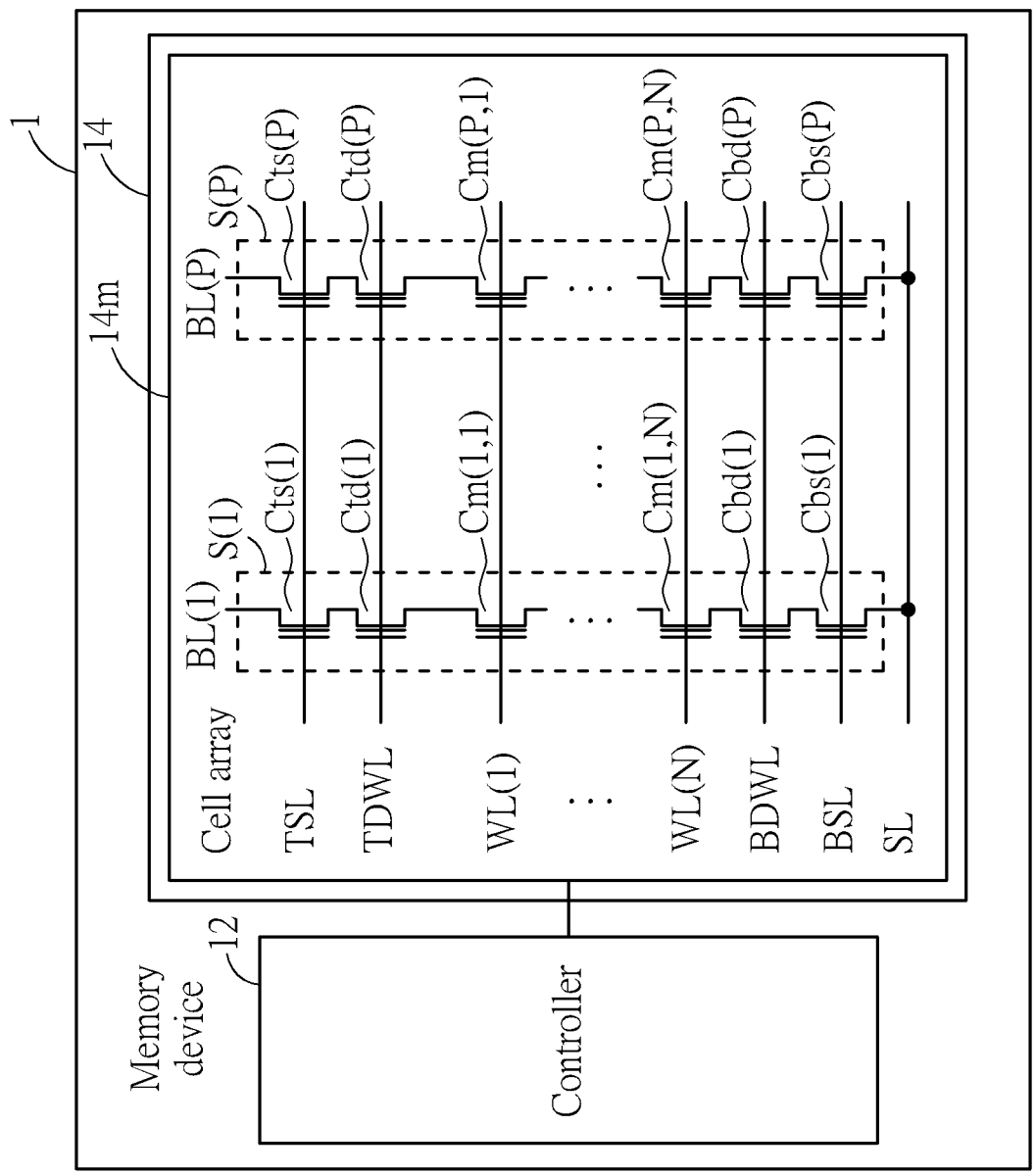
FIG. 1 is a block diagram of a memory device according to an embodiment of the invention.

FIG. 1 is a block diagram of a memory device 1 according to an embodiment of the invention. The memory device 1 may be a 3-dimentional (3D) NAND flash device, and include a controller 12 and a memory circuit 14. The memory circuit 14 may contain a plurality of cell arrays 14$m$ stacked in layers and used for data storage, m being a positive integer ranging from 1 to M, and M being a positive integer. FIG. 1 only shows one cell array 14$m$ for simplicity. The controller 12 may be coupled to the memory circuit 14 to control reading, programming and/or erasing operations of the memory circuit 14, and may communicate with an external host to receive data for storage in the memory circuit 14 and to transmit data fetched from the memory circuit 14. Further, the controller 12 may apply a recovery process prior to programming the cell array 14$m$ to reduce program disturbance.

The cell array 14$m$ may include top select cells Cts(1) to Cts(P), top dummy cells Ctd(1) to Ctd(P), memory cells Cm(1, 1) to Cm(P,N), bottom dummy cells Cbd(1) to Cbd(P), and bottom select cells Cbs(1) to Cbs(P), a top select line TSL, a top dummy word line TDWL, word lines WL(1) to WL(N), a bottom dummy word line BDWL, a bottom select line BSL, a source line SL, bit lines BL(1) to BL(P), wherein N, P are positive integers, e.g., N=64 and P=8192. The top select cells Cts(1) to Cts(P), the top dummy cells Ctd(1) to Ctd(P), the memory cells Cm(1, 1) to Cm(P,N), the bottom dummy cells Cbd(1) to Cbd(P) and the bottom select cells Cbs(1) to Cbs(P) may be arranged into cell strings S(1) to S(P). In some embodiments, the cell array 14$m$ may include two or more rows of top select cells, top dummy cells, bottom dummy cells or bottom select cells. Moreover, in some embodiments, the cell array 14$m$ may omit the bottom dummy cells Cbd(1) to Cbd(P).

Each of the top select cells Cts(1) to Cts(P), the top dummy cells Ctd(1) to Ctd(P), the memory cells Cm(1, 1) to Cm(P,N), the bottom dummy cells Cbd(1) to Cbd(P) and the bottom select cells Cbs(1) to Cbs(P) may be a floating-gate transistor or a charge-trapping transistor including a control terminal, a first terminal and a second terminal, and may be of a single-level cell (SLC) type, a multi-level cell (MLC) type, a triple-level cell (TLC) type, a quad-level cell (QLC) type, or a higher-level type. The top select cells Cts(1) to Cts(P), the top dummy cells Ctd(1) to Ctd(P), the bottom dummy cells Cbd(1) to Cbd(P) and the bottom select cells Cbs(1) to Cbs(P) may be programmed into a higher program state, resulting in threshold voltages thereof exceeding the threshold voltages of the memory cells Cm(1,1) to Cm(P,N) in an erased state. The top select line TSL may be coupled to the control terminals of the top select cells Cts(1) to Cts (P), and the bit lines BL(1) to BL (P) may be respectively coupled to the first terminals of the top select cells Cts(1) to Cts(P). The top dummy word line TDWL may be coupled to the control terminals of the top dummy cells Ctd(1) to Ctd(P), and the first terminals of the top dummy cells Ctd(1) to Ctd(P) may be respectively coupled to the second terminals of the top select cells Cts(1) to Cts(P). The word lines WL(1) to WL(N) may be coupled to the memory cells Cm(1,1) to Cm(P,1) of the first row to the memory cells Cm(1,N) to Cm(P,N) of the Nth row, respectively, and the first terminals of the memory cells Cm(1,1) to Cm(P,1) may be coupled to the second terminals of the top dummy cells Ctd(1) to Ctd(P), respectively. The bottom dummy word line BDWL may be coupled to the control terminals of the bottom dummy cells Cbd(1) to Cbd(P), and the first terminals of the bottom dummy cells Cbd(1) to Cbd(P) may be respectively coupled to the second terminals of the memory cells Cm(1,N) to Cm(P,N). The bottom select line BSL may be coupled to the control terminals of the bottom select cells Cbs(1) to Cbs (P), the first terminals of the bottom select cells Cbs(1) to Cbs (P) may be respectively coupled to the second terminals of the bottom dummy cells Cbd(1) to Cbd(P), and the source line SL may be coupled to the second terminals of the bottom select cells Cbs(1) to Cbs(P). Each string S(p) may comprise memory cells Cm(p,1) to Cm(p,N) coupled in series, p being a integer and 1≤p≤P.

The controller 12 may be coupled to the top select line TSL, the top dummy word line TDWL, the word lines WL(1) to WL(N), the bottom dummy word line BDWL, the bottom select line BSL, the source line SL and the bit lines BL(1) to BL(P) to control the operations of the top select cells Cts(1) to Cts(P), the top dummy cells Ctd(1) to Ctd(P), the memory cells Cm(1,1) to Cm(P,N), the bottom dummy cells Cbd(1) to Cbd(P) and the bottom select cells Cbs(1) to Cbs(P). In a program operation, data may be programmed into the memory cells Cm(1,1) to Cm(P,N) from the source line side to the bit line side (e.g., from the Nth row to the first row), or from the bit line side to the source line side (e.g., from the first row to the Nth row). When programming a selected row, the controller 12 may apply a supply voltage (e.g., 3.3V) to the top selection line TSL, a ground voltage (e.g., 0V) to the bottom selection line BSL, a program voltage (e.g., 20V) to a selected word line (e.g., WL(1)), a pass voltage (e.g., 10V) to unselected word lines (e.g., WL(2) to WL(N)), the top dummy word line TDWL and the bottom dummy word line BDWL, the ground voltage to selected bit lines (e.g., BL(1) and BL(2)) for programming, and the supply voltage to unselected bit lines (e.g., BL(3) and BL(P)) for inhibiting programming. In a program inhibited string (e.g., BL(3)), the program voltage on the selected word line (e.g., WL(1)) and the pass voltage on the unselected word lines (e.g., WL(2) to WL(N)) may be coupled to the channel regions of respective cells (e.g., memory cells Cm(3,1) to Cm(3,N), a top dummy cell Ctd(1) and a bottom dummy cell Ctb(1)) to establish a self-boosting channel having a self-boosting voltage (e.g., 6V to 8V), decreasing the potential difference between the program voltage applied to the selected word line and the self-boosting voltage in the self-boosting channel, and leading to a reduction in program disturbance. Since the level of the self-boosting voltage directly affects the amount of program disturbance, prior to the program operation, the controller 12 may apply a recovery process in a program operation to discharge excessive electrons from the channels of the top select cells Cts(1) to Cts(P), the top dummy cells Ctd(1) to Ctd(P), the memory cells Cm(1,1) to Cm(P,N), the bottom dummy cells Cbd(1) to Cbd(P) and the bottom select cells Cbs(1) to Cbs(P) to ensure a maximal self-boosting voltage in the self-boosting channels of program inhibited strings.

Figure 2:
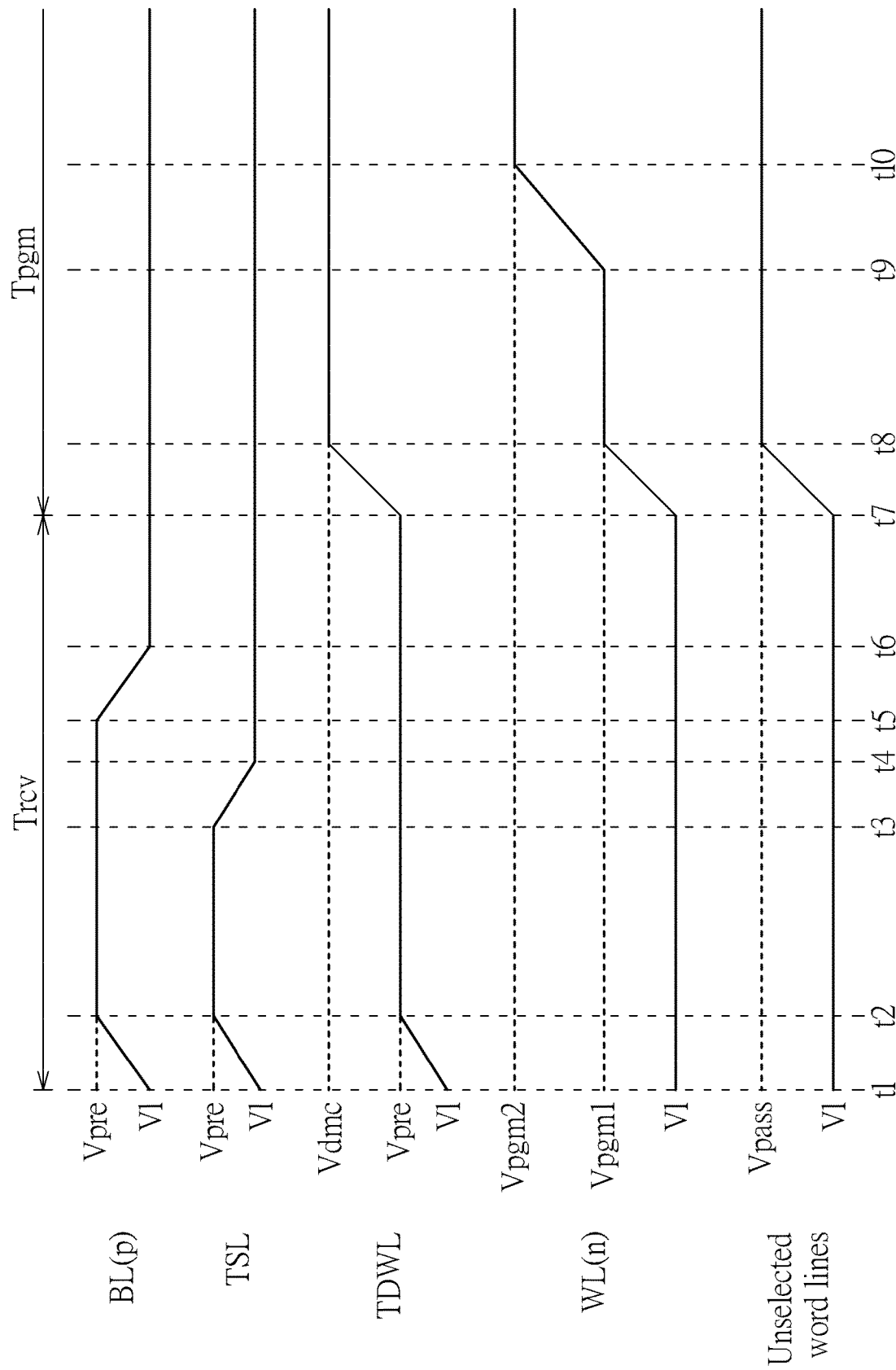
FIG. 2 shows waveforms of selected signals of the memory device in FIG. 1 when adopting an exemplary recovery method.

FIG. 2 shows a timing diagram of selected signals of the memory device 1 when adopting an exemplary program operation. The selected signals include signals on an unselected bit line BL(p), the top select line TSL, the top dummy word line TDWL, a selected word line WL(n) and unselected word lines, n being a integer and 1≤n≤N. The unselected word lines may be the word lines WL(1) to WL(n−1), WL(n+1) to WL(n). The memory device 1 may perform a recovery process in a recovery period Trcv prior to a program process in a program period Tpgm. From Times t1 to t2, the controller 12 drives the unselected bit line BL(p), the top select line TSL and the top dummy word line TDWL from a low voltage V1 (e.g., 0V) to a pre-pulse voltage Vpre (e.g., 4V), while holding the selected word line WL(n) and the unselected word line at the low voltage V1. At Time t2, the voltages on the unselected bit line BL(p), the top select line TSL and the top dummy word line TDWL reach the pre-pulse voltage Vpre, establishing channels of a top select cell and a top dummy cell in the program inhibited string, and producing a path between the drain of the top dummy cell and the unselected word line to discharge electrons from neighboring memory cells. From Times t3 to t4, the controller 12 drives the top select line TSL from the pre-pulse voltage Vpre to the low voltage V1. At Time t4, the voltage on the top select line TSL reaches the low voltage V1, the top select cell Cts(p) is turned off to cut off the path of discharging electrons, and electrons released from the channel of the top select cell Cts(p) may be discharged via the bit line BL(p). From Times t5 to t6, the controller 12 drives the unselected bit line BL(p) from the pre-pulse voltage Vpre to the low voltage V1. At Time t6, the voltage on the unselected bit line BL(p) reaches the low voltage V1 and stops discharging electrons. Between Times t3 and t7, the controller 12 maintains the voltage on the top dummy word line TDWL at the pre-pulse voltage Vpre, accumulating the electrons in the channel of the top dummy cell Ctd(p). From Times t7 to t8, the controller 12 drives the top dummy word line TDWL from the pre-pulse voltage Vpre to a dummy cell voltage Vdmc, drives the unselected word lines from the low voltage V1 to a pass voltage Vpass, and drives the selected word line WL(n) from the low voltage V1 to a first program pulse voltage Vpgm1, establishing the self-boosting channel of the program inhibited string. The dummy cell voltage Vdmc and the first program pulse voltage Vpgm2 may be substantially equal to the pass voltage Vpass. From Times t9 to t10, the controller 12 further drives the selected word line WL(n) drives the first program pulse voltage Vpgm1 to a second program pulse voltage Vpgm2. The second program pulse voltage Vpgm2 may be higher than the first program pulse voltage Vpgm1. After Time t7, the increasing voltage on the selected word line WL(n) may gradually raise the self-boosting voltage, pulling the electrons from the channel of the top dummy cell Ctd(p), causing the self-boosting voltage to step down, and leading to inadvertent program in the memory cells as a result of program disturbance.

Figure 3:
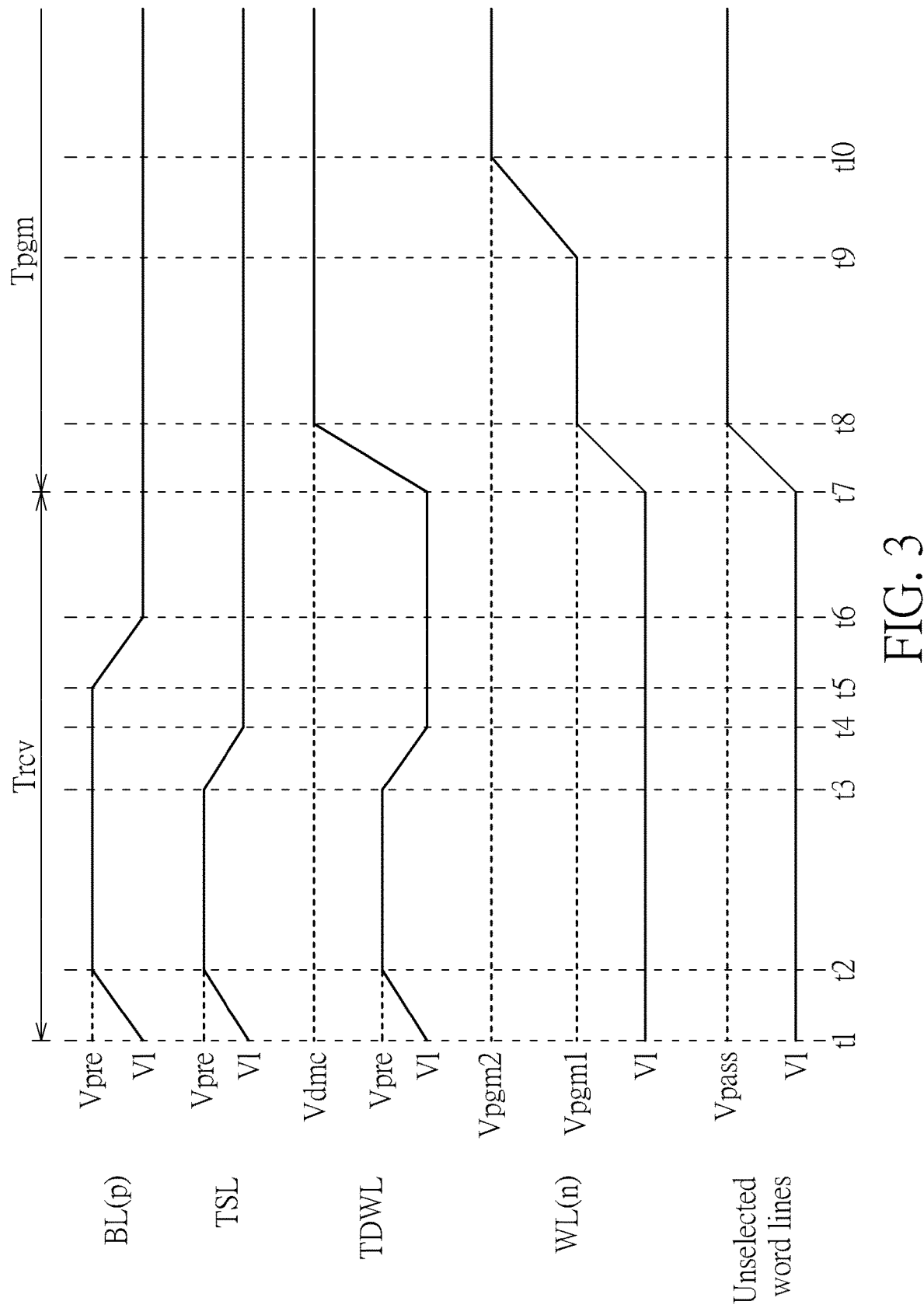
FIG. 3 shows waveforms of selected signals of the memory device in FIG. 1 when adopting another exemplary recovery method.

FIG. 3 shows a timing diagram of selected signals of the memory device 1 when adopting another exemplary program operation. The selected signals include signals on an unselected bit line BL(p), the top select line TSL, the top dummy word line TDWL, a selected word line WL(n) and unselected word lines. The memory device 1 may perform a recovery process in a recovery period Trcv prior to a program process in a program period Tpgm. Between Times t1 and t3 and Times t7 and t10, the memory device 1 operates in a manner similar to FIG. 2. From Times t3 to t4, the controller 12 drives the top select line TSL and the top dummy word line TDWL from the pre-pulse voltage Vpre to the low voltage V1. At Time t4, the voltages on the top select line TSL and the top dummy word line TDWL reach the low voltage V1, and the top select cell Cts(p) and the top dummy cell Ctd(p) in a program inhibited string are turned off. Since the threshold voltages of the top select cell Cts(p) and the top dummy cell Ctd(p) exceed the threshold voltages of the memory cells in the erased state, electrons from the channel of the top dummy cell Ctd(p) may be transferred to the neighboring memory cells rather than the unselected bit line BL(p). From Times t4 to t7, the controller 12 holds the top dummy word line TDWL at the low voltage V1. After Time t7, owing to the electrons from the top dummy cell Ctd(p), the self-boosting voltage is reduced to a lower level, leading to unintended programing of a memory cell of the program inhibit string owing to program disturbance.

Figure 4:
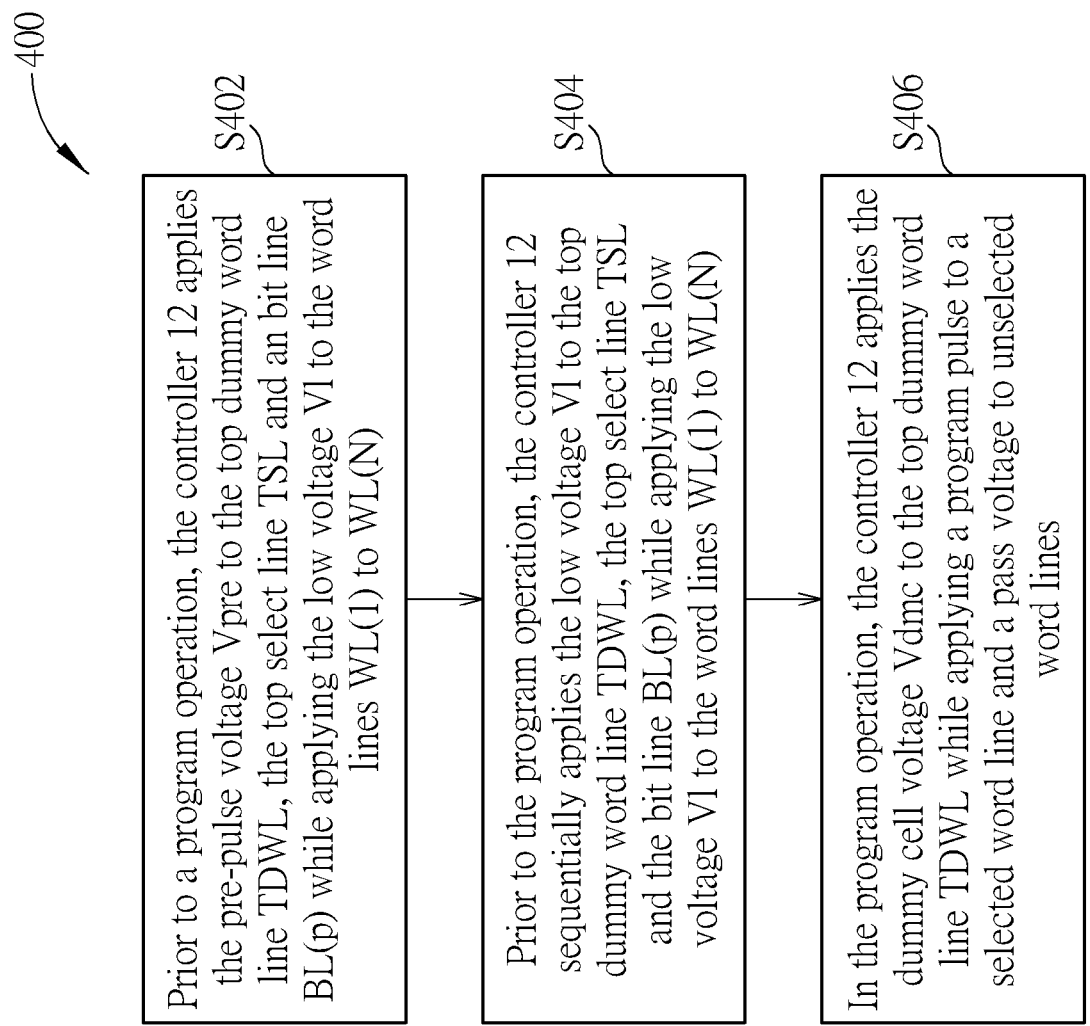
FIG. 4 is a flowchart of a method of operating the memory device in FIG. 1 according to an embodiment of the invention.

FIG. 4 is a flowchart of a method 400 of operating the memory device 1 according to an embodiment of the invention. The method 400 comprises Steps S402 to S406, operating a program inhibit string S(p) of the memory device 1 to discharge excessive electrons prior to a program operation. Steps S402 and S404 are used to remove electrons from the program inhibit string S(p), and Step S406 is used to protect the program inhibit string S(p) against program disturbance. Any reasonable step change or adjustment is within the scope of the disclosure. Steps S402 to S406 are explained as follows:

Step S402: Prior to a program operation, the controller 12 applies the pre-pulse voltage Vpre to the top dummy word line TDWL, the top select line TSL and an bit line BL(p) while applying the low voltage V1 to the word lines WL(1) to WL(N);

Step S404: Prior to the program operation, the controller 12 sequentially applies the low voltage V1 to the top dummy word line TDWL, the top select line TSL and the bit line BL(p) while applying the low voltage V1 to the word lines WL(1) to WL(N);

Step S406: In the program operation, the controller 12 applies the dummy cell voltage Vdmc to the top dummy word line TDWL while applying a program pulse to a selected word line and a pass voltage to unselected word lines.

In Step S402, the pre-pulse voltage Vpre is applied to the top dummy cell Ctd(p), the top select cell Cts(p) and the bit line BL(p) of the program inhibit string S(p) to extract electrons from the memory cells Cm(p,1) to Cm(p,N), and in particular, from the memory cell Cm(p,1) of the program inhibit string S (p) and discharge the electrons into the bit line BL(p). In Step S404, when the low voltage V1 is applied to the top dummy cell Ctd(p) while applying the pre-pulse voltage Vpre to the top select cell Cts(p) and the bit line BL(p), electrons released from the top dummy cell Ctd(p) are discharged from the source of the top select cell Cts(p) into the bit line BL(p). Similarly, when the low voltage V1 is applied to the top select cell Cts (p) while applying the pre-pulse voltage Vpre to the bit line BL(p), electrons released from the top select cell Cts(p) are discharged into the bit line BL(p). In this manner, no electron or a very limited number of electrons will return to the memory cells of the program inhibit string S(p) during the program operation in Step S406. The dummy cell voltage Vdmc may be substantially equal to or different from the pass voltage Vpass.

Figure 5:
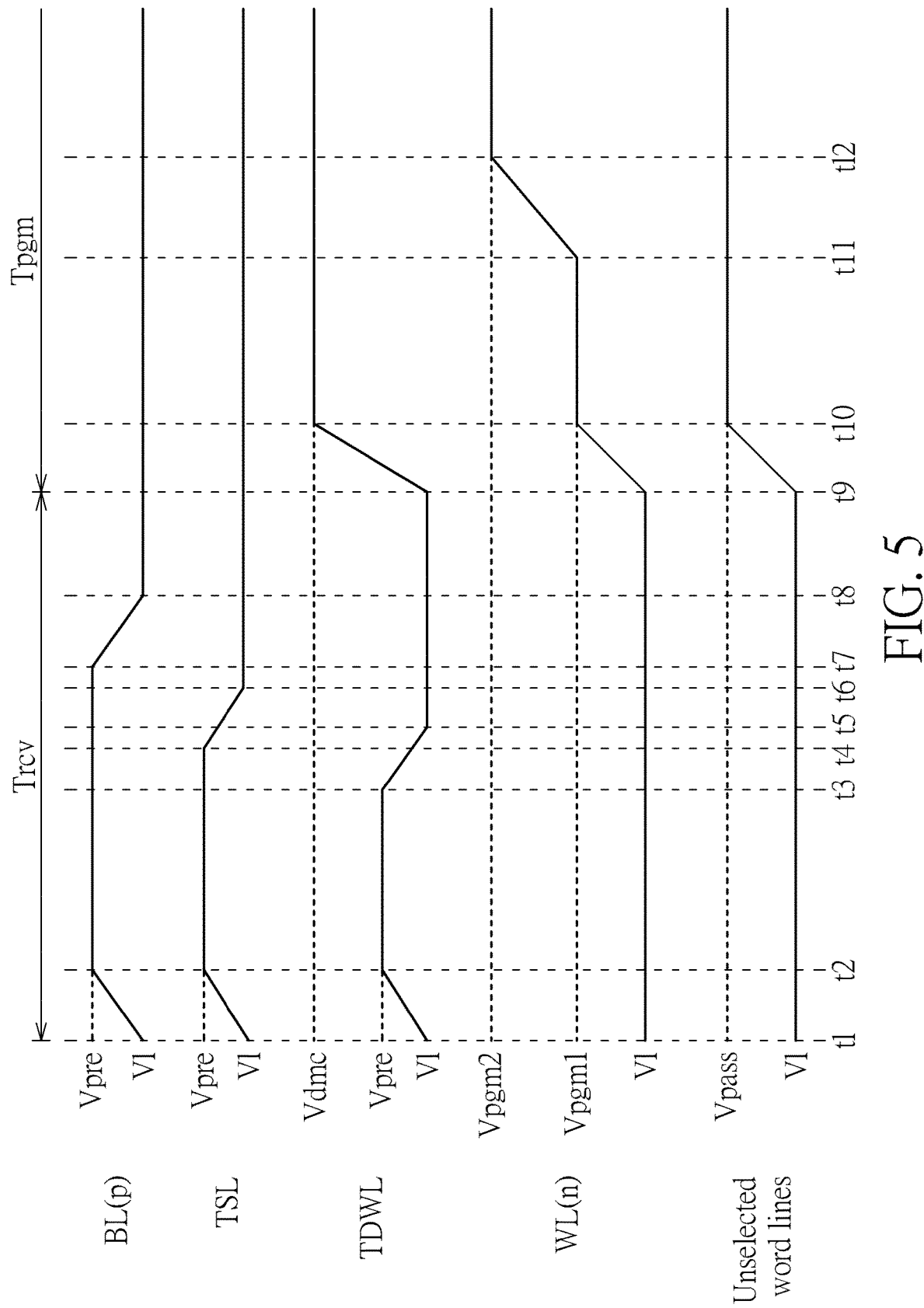
FIG. 5 shows waveforms of selected signals of the memory device in FIG. 1 when adopting the method in FIG. 4.

FIG. 5 shows a timing diagram of selected signals of the memory device 1 when adopting the method 400. The selected signals include signals on an unselected bit line BL(p), the top select line TSL, the top dummy word line TDWL, a selected word line WL (n) and unselected word lines. The memory device 1 may perform a recovery process in a recovery period Trcv prior to a program process in a program period Tpgm, the recovery period Trcv occurs between Times t1 to t9, and the program period Tpgm occurs after Time t9. Between Times t1 and t3, the memory device 1 operates in a manner similar to FIG. 2. From Times t3 to t5, the controller 12 drives the top dummy word line TDWL from the pre-pulse voltage Vpre to the low voltage V1. At Time t5, the voltage on the top dummy word line TDWL reaches the low voltage V1, and the top dummy cell Ctd(p) in a program inhibited string is turned off. From Times t4 to t6, the controller 12 drives the top select line TSL from the pre-pulse voltage Vpre to the low voltage V1. At Time t6, the voltage on the top select line TSL reaches the low voltage V1, and the top select cell Cts (p) in a program inhibited string is turned off. From Times t7 to t8, the controller 12 drives the bit line BL (p) from the pre-pulse voltage Vpre to the low voltage V1. At Time t8, the voltage on the bit line BL(p) reaches the low voltage V1, completing removal of electrons from the program inhibited string. From Times t9 to t12, the memory device 1 operates in a manner similar to the operations at Times t7 to t10 in FIG. 2. After Time t9, since a large quantity of electrons are removed program inhibited string, the self-boosting voltage steps up, facilitating suppression of program disturbance during the program operation and improving data reliability.

Although the method 400 is described in terms of the top dummy word line TDWL, the top select line TSL and the bit line BL(p), the method 400 is also applicable to the bottom dummy word line BDWL, the bottom select line BSL and the source line SL by replacing the top dummy word line TDWL, the top select line TSL and the bit line BL(p) in the method 400 with the bottom dummy word line BDWL, the bottom select line BSL and the source line SL, respectively, so as to discharge unwanted electrons into the source line SL from the source side.

Figure 6:
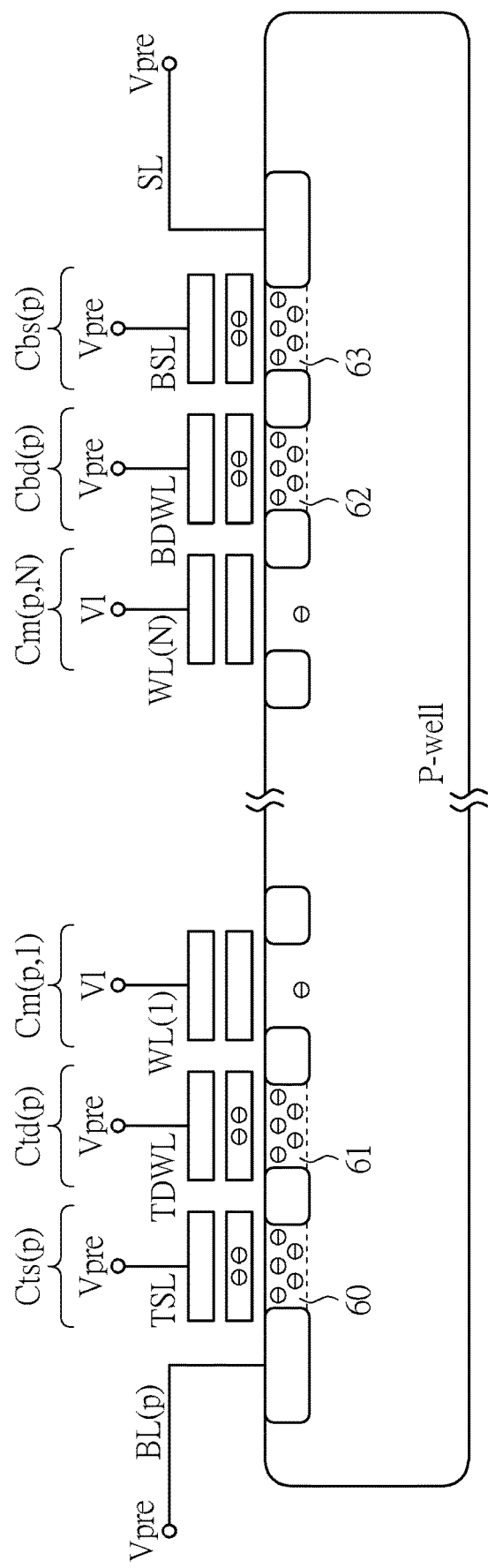
FIGS. 6 to 8 show the effect the method in FIG. 4.
Figure 7:
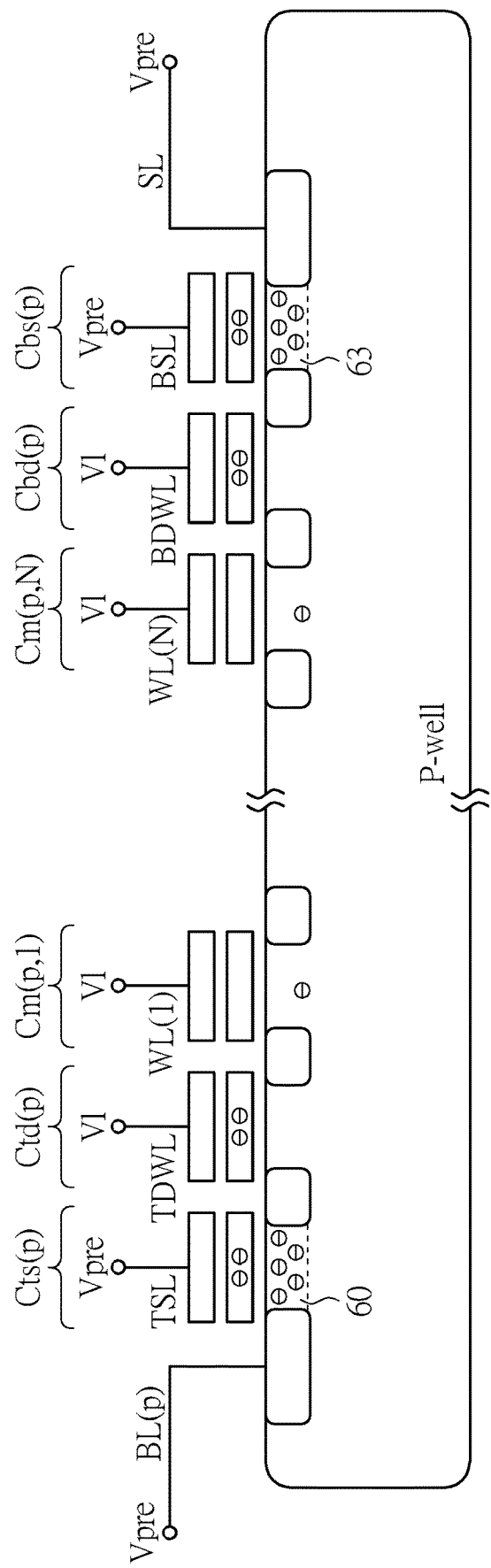
Figure 8:
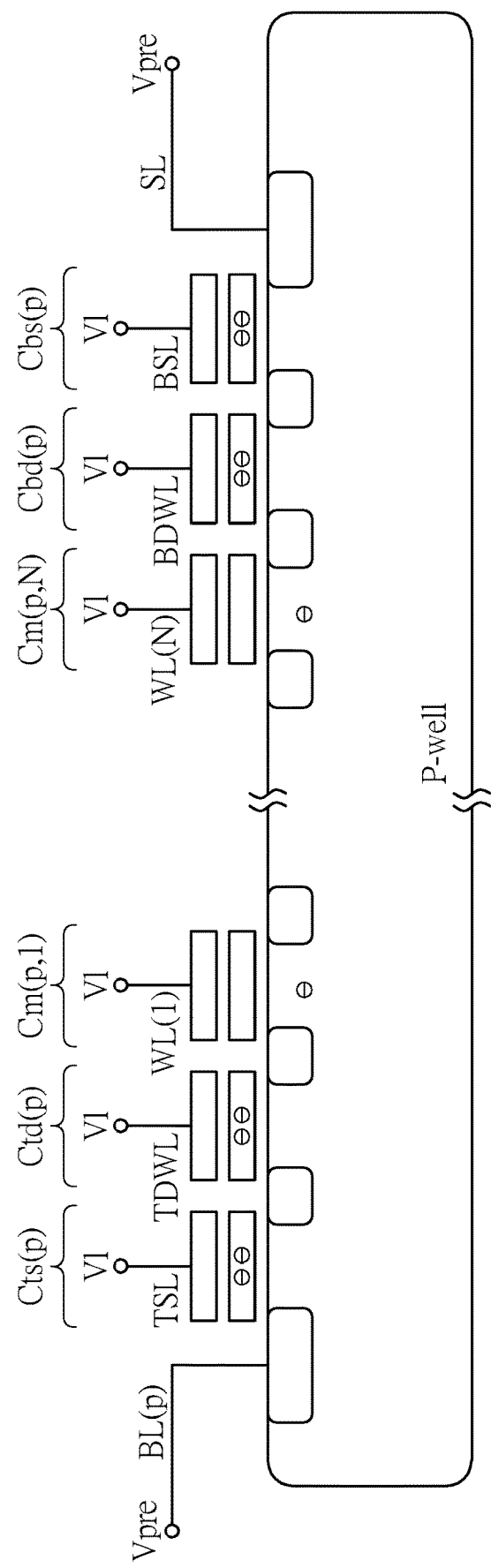

FIGS. 6 to 8 show the effects of Steps S402 and S404 on a string S(p) of the memory device 1 in cross-sectional views. The string S(p) is inhibited from being programmed and includes the top select cell Cts(p), the top dummy cell Ctd (p), the memory cells Cm (p,1) to Cm(p,N), the bottom dummy cell Cbd(p) and the bottom select cell Cbs(p). In FIG. 6, the pre-pulse voltage Vpre is applied to the bit line BL(p), the source line SL, and the control terminals of the top select cell Cts(p), the top dummy cell Ctd(p), the bottom dummy cell Cbd(p) and the bottom select cell Cbs(p), and the low voltage V1 is applied to the control terminals of the memory cells Cm(p,1) to Cm(p,N), inducing channels 60 to 63 by the pre-pulse voltage Vpre, pulling electrons from the memory cells Cm(p,1) and Cm(p,N), and leaking the electrons from the source of the top dummy cell Ctd(p) into the bit line BL(p), and from the drain of the bottom dummy cell Cbd(p) into the source line SL. In FIG. 7, the low voltage V1 is applied to the control terminals of the top dummy cell Ctd(p), the bottom dummy cell Cbd(p) and the memory cells Cm(p,1) to Cm(p,N), and the pre-pulse voltage Vpre is applied to the bit line BL(p), the source line SL, and the control terminals of the top select cell Cts (p) and the bottom select cell Cbs(p), removing the channels 61 and 62 while maintaining the channels 60 and 63, pulling electrons released from the top dummy cell Ctd(p) and the bottom dummy cell Cbd(p), discharging electrons from the source of the top select cell Cts (p) into the bit line BL(p), and from the drain of the bottom select cell Cbs(p) into the source line SL. In FIG. 8, the low voltage V1 is applied to the control terminals of the top select cell Cts(p), the top dummy cell Ctd(p), the memory cells Cm(p,1) to Cm(p,N), the bottom dummy cell Cbd(p) and the bottom select cell Cbs(p), and the pre-pulse voltage Vpre is applied to the bit line BL(p) and the source line SL, removing the channels 60 to 63, pulling electrons from the top select cell Cts(p) and the bottom select cell Cbs(p), and discharging the electrons into the bit line BL(p) and the source line SL. In the fashion as depicted in FIGS. 6 to 8, excessive electrons are discharged into the bit line BL(p) and the source line SL prior to programming, increasing the self-boosting voltage in the self-boosting channels and reducing the level of program disturbance during the program operation.

Figure 9:
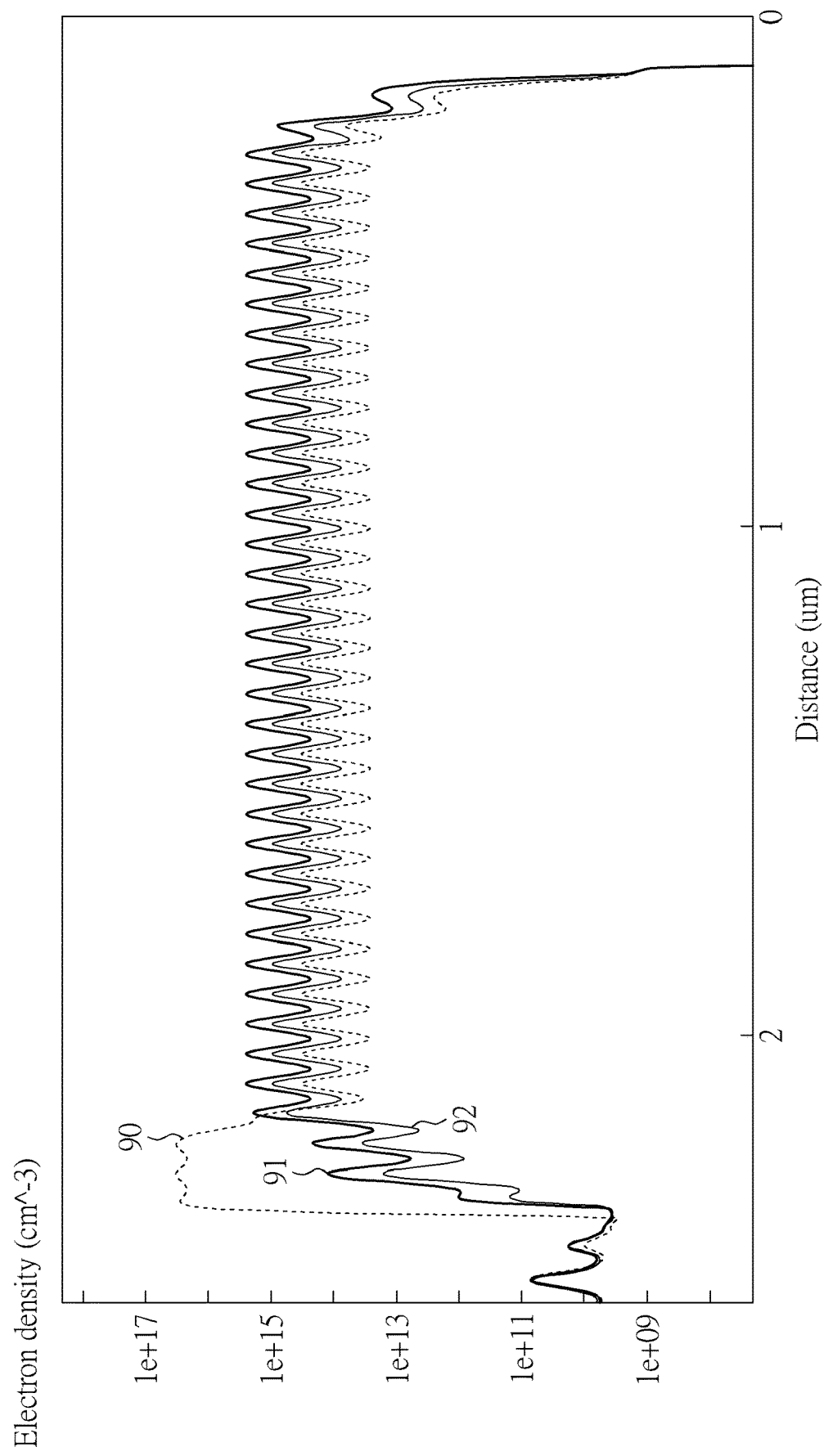
FIG. 9 shows electron distributions resulting from the methods in FIGS. 2, 3 and 5.

FIG. 9 shows electron distributions 90 to 92 of the methods in FIGS. 2, 3 and 5, respectively, where the horizontal axis represents the distance from the source line SL and the vertical axis represents electron density. The electron distribution 90 shows a significant quantity of electrons are accumulated in the top select cell Cts(p) and the top dummy cell Ctd(p) when adopting the method in FIG. 2, the electron distribution 91 shows a larger quantity of electrons are accumulated in the top select cell Cts(p) and the top dummy cell Ctd(p) when adopting the method in FIG. 3, and the electron distribution 92 shows a reduced quantity of electrons in all cells on the bit line BL(p) when adopting the method in FIG. 5.

Figure 10:
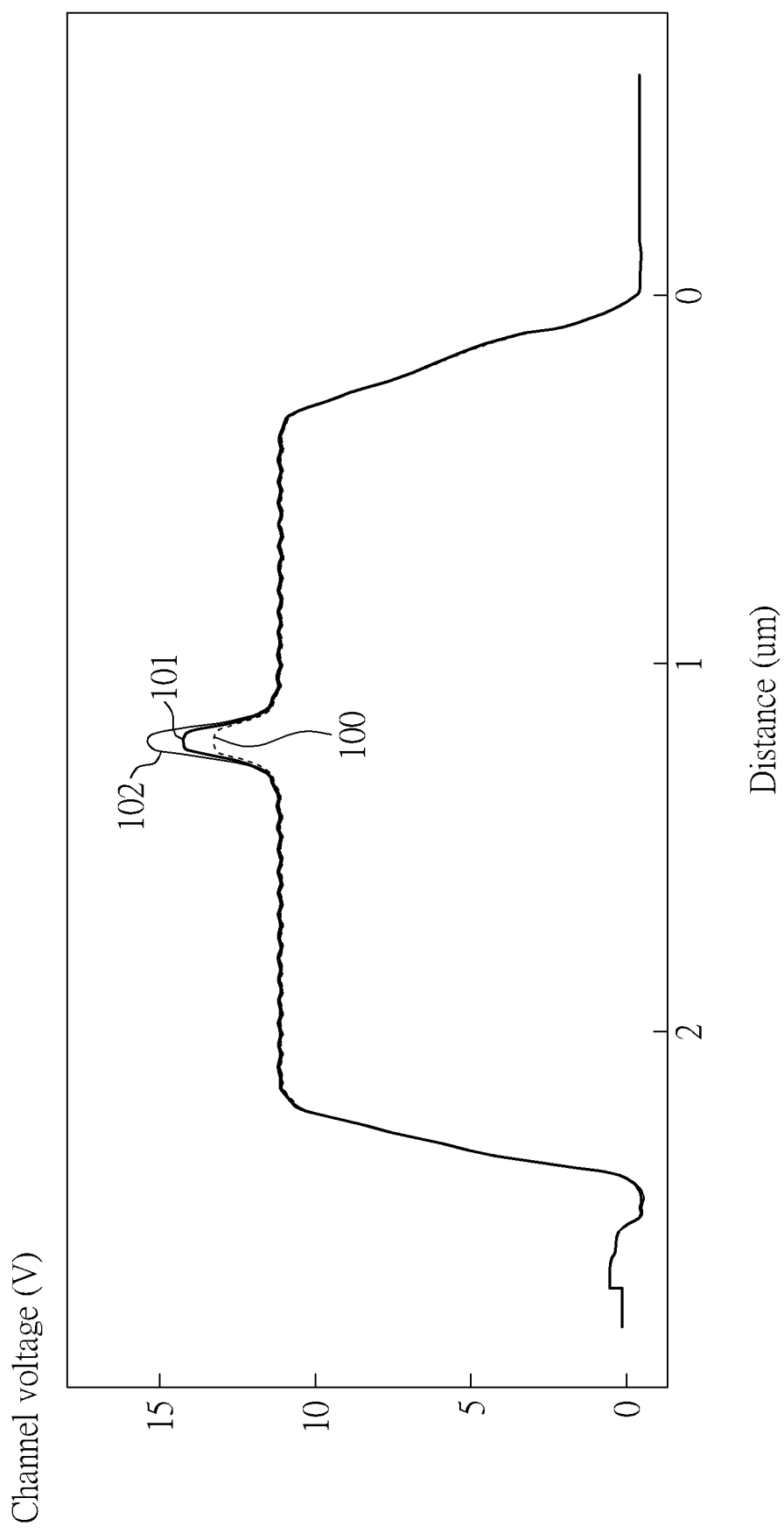
FIG. 10 shows channel potential variations resulting from the methods in FIGS. 2, 3 and 5.

FIG. 10 shows channel voltages 100 to 102 of the methods in FIGS. 2, 3 and 5, respectively, where the horizontal axis represents the distance from the source line SL and the vertical axis represents the channel voltage. Compared with the channel voltages 100 and 101, the channel voltage 102 has the highest channel voltage, and therefore, the program disturbance is the least among the methods in FIGS. 2, 3 and 5.

The memory device 1 and the method 400 are employed to sequentially extract excessive electrons from a program inhibited string of the memory circuit 14, reducing electrons in the program inhibited string, increasing self-boosting voltage, reducing the level of program disturbance and delivering enhanced data reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of operating a memory device, the memory device comprising a top select cell, a top dummy cell and a string of memory cells, the top select cell having a first terminal coupled to a bit line, a control terminal coupled to a top select line, the top dummy cell having a first terminal coupled to a second terminal of the top select cell, a control terminal coupled to a top dummy word line, the string of memory cells having a first terminal coupled to a second terminal of the top dummy cell, and control terminals coupled to respective word lines, the method comprising:

prior to a program operation, applying a pre-pulse voltage of a same magnitude to the top dummy word line, the top select line and the bit line while applying a low voltage to the word lines, and then sequentially applying the low voltage to the top dummy word line, the top select line and the bit line while applying the low voltage to the word lines;

wherein the bit line is coupled to an unselected string during the program operation; and the word lines include selected word lines and unselected word lines during the program operation.

2. The method of claim 1, further comprising:

in the program operation, applying a top dummy cell voltage to the top dummy word line while applying a program pulse to a selected word line of the word lines.

3. The method of claim 2, wherein the pre-pulse voltage is less than the top dummy cell voltage.

4. The method of claim 2, further comprising:

in the program operation, applying a pass voltage to the unselected word lines of the word lines.

5. The method of claim 4, wherein the pass voltage is less than a program voltage.

6. The method of claim 2, further comprising:

in the program operation, applying the low voltage to the bit line and the top select line to unselect the string of memory cells.

7. The method of claim 1, wherein the low voltage is a ground voltage.

8. The method of claim 1, wherein the memory device is a 3-dimentional NAND flash memory device.

9. The method of claim 1, wherein:

the memory device further comprises a bottom dummy word line, a bottom select line, a source line configured to receive a ground voltage, a bottom dummy cell, and a bottom select cell, the bottom dummy cell having a first terminal coupled to the second terminal of the string of memory cells, a control terminal coupled to the bottom dummy word line, and a second terminal, and the bottom select cell having a first terminal coupled to the second terminal of the bottom dummy cell, a control terminal coupled to the bottom select line, and a second terminal coupled to the source line; and the method further comprises applying the pre-pulse voltage to the bottom dummy word line, the bottom select line and the source line while applying the low voltage to the word lines, and sequentially applying the low voltage to the bottom dummy word line, the bottom select line and the source line while applying the low voltage to the word lines.

\* \* \* \* \*